(12) United States Patent
Cheng et al.

(10) Patent No.: US 9,224,822 B2
(45) Date of Patent: Dec. 29, 2015

(54) HIGH PERCENTAGE SILICON GERMANIUM ALLOY FIN FORMATION

(71) Applicant: GLOBALFOUNDRIES INC., Grand Cayman (KY)

(72) Inventors: Kangguo Cheng, Schenectady, NY (US); Pouya Hashemi, White Plains, NY (US); Ali Khakifirooz, Mountain View, CA (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 128 days.

(21) Appl. No.: 14/023,007

(22) Filed: Sep. 10, 2013

(65) Prior Publication Data

US 2015/0069465 A1    Mar. 12, 2015

(51) Int. Cl.
*H01L 21/20* (2006.01)
*H01L 21/36* (2006.01)
*H01L 29/36* (2006.01)
*H01L 29/161* (2006.01)
*H01L 29/78* (2006.01)
*H01L 29/66* (2006.01)
*H01L 21/02* (2006.01)

(52) U.S. Cl.
CPC .............. *H01L 29/36* (2013.01); *H01L 29/161* (2013.01); *H01L 29/66795* (2013.01); *H01L 29/785* (2013.01); *H01L 21/02529* (2013.01); *H01L 21/02532* (2013.01)

(58) Field of Classification Search
CPC ............ H01L 29/785; H01L 29/66795; H01L 21/845; H01L 21/823431; H01L 27/0924; H01L 29/41791; H01L 21/02381; H01L 21/324; H01L 27/10879
USPC .......................... 438/509, 530, 412, 413, 933
See application file for complete search history.

(56) References Cited

U.S. PATENT DOCUMENTS

| | | |
|---|---|---|
| 6,190,975 B1 | 2/2001 | Kubo et al. |
| 6,649,496 B2 | 11/2003 | Kanzawa et al. |
| 6,930,026 B2 | 8/2005 | Kanzawa et al. |
| 7,405,422 B2 | 7/2008 | Chu et al. |
| 7,700,446 B2 | 4/2010 | Anderson et al. |
| 7,935,617 B2 | 5/2011 | Tweet |
| 7,999,250 B2 | 8/2011 | Gogoi et al. |
| 8,138,579 B2 | 3/2012 | Liu et al. |

*Primary Examiner* — Thien F Tran
(74) *Attorney, Agent, or Firm* — Scully, Scott, Murphy & Presser, P.C.

(57) ABSTRACT

A layer of a silicon germanium alloy containing 30 atomic percent or greater germanium and containing substitutional carbon is grown on a surface of a semiconductor layer. The presence of the substitutional carbon in the layer of silicon germanium alloy compensates the strain of the silicon germanium alloy, and suppresses defect formation. Placeholder semiconductor fins are then formed to a desired dimension within the layer of silicon germanium alloy and the semiconductor layer. The placeholder semiconductor fins will relax for the most part, while maintaining strain in a lengthwise direction. An anneal is then performed which may either remove the substitutional carbon from each placeholder semiconductor fin or move the substitutional carbon into interstitial sites within the lattice of the silicon germanium alloy. Free-standing permanent semiconductor fins containing 30 atomic percent or greater germanium, and strain in the lengthwise direction are provided.

10 Claims, 7 Drawing Sheets

HIGH PERCENTAGE SILICON GERMANIUM ALLOY FIN FORMATION

BACKGROUND

The present application relates to a semiconductor structure and a method of forming the same. More particularly, the present application relates to a method of forming a semiconductor fin containing a silicon germanium alloy portion having 30 atomic percent or greater germanium, and a semiconductor structure that includes such semiconductor fins.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of CMOS devices. FinFETs are non-planar semiconductor devices which include at least one semiconductor fin protruding from a surface of a substrate. A gate dielectric can be formed in direct physical contact with each vertical sidewall of the at least one semiconductor fin and, optionally, in direct physical contact with a topmost surface of the semiconductor fin. A gate conductor can be formed on the gate dielectric and straddling a portion of the at least one semiconductor fin. FinFETs can increase the on-current per unit area relative to planar field effect transistors.

SUMMARY

A layer of a silicon germanium alloy containing 30 atomic percent or greater germanium and containing substitutional carbon is epitaxially grown on a surface of a semiconductor layer. The presence of the substitutional carbon in the layer of silicon germanium alloy compensates the strain of the silicon germanium alloy, and suppresses defect formation. Placeholder semiconductor fins are then formed to a desired dimension within the layer of silicon germanium alloy and the semiconductor layer. The placeholder semiconductor fins will relax for the most part, while maintaining strain in a lengthwise direction. An anneal is then performed which may either remove the substitutional carbon from each placeholder semiconductor fin or move the substitutional carbon into interstitial sites within the lattice of the silicon germanium alloy. Free-standing permanent semiconductor fins containing 30 atomic percent or greater germanium, and strain in the lengthwise direction are provided.

In one aspect of the present application, a method of forming a semiconductor structure is provided. In accordance with one embodiment of the present application, the method includes forming at least one placeholder semiconductor fin on a surface of a substrate. The at least one placeholder semiconductor fin comprises, from bottom to top, a semiconductor material portion and a silicon germanium alloy portion. The silicon germanium alloy portion of the at least one placeholder semiconductor fin contains 30 atomic percent or greater germanium, a first content of substitutional carbon and a strain in a lengthwise direction of said at least one placeholder semiconductor fin. Next, the at least one placeholder semiconductor fin is annealed. The anneal converts the at least one placeholder semiconductor fin into at least one permanent semiconductor fin comprising, for bottom to top, the semiconductor material portion and a silicon germanium alloy portion. The silicon germanium alloy portion of the at least one permanent semiconductor fin contains 30 atomic percent or greater germanium, a second content of substitutional carbon and a strain in a lengthwise direction of said at least one permanent semiconductor fin. In accordance with the present application, the second content of substitutional carbon of the silicon germanium alloy portion of the at least one permanent semiconductor fin is less than the first content of substitutional carbon of the silicon germanium alloy portion of the at least one placeholder semiconductor fin.

In another aspect of the present application, a semiconductor structure is provided. In one embodiment of the present application, the semiconductor structure of the present application includes at least one semiconductor fin located on a surface of a substrate, wherein the at least one semiconductor fin includes, from bottom to top, a semiconductor material portion and a silicon germanium alloy portion. The silicon germanium alloy portion of the at least one semiconductor fin contains 30 atomic percent or greater germanium, and has a strain in a lengthwise direction of the at least one semiconductor fin.

DETAILED DESCRIPTION

Figure 1:
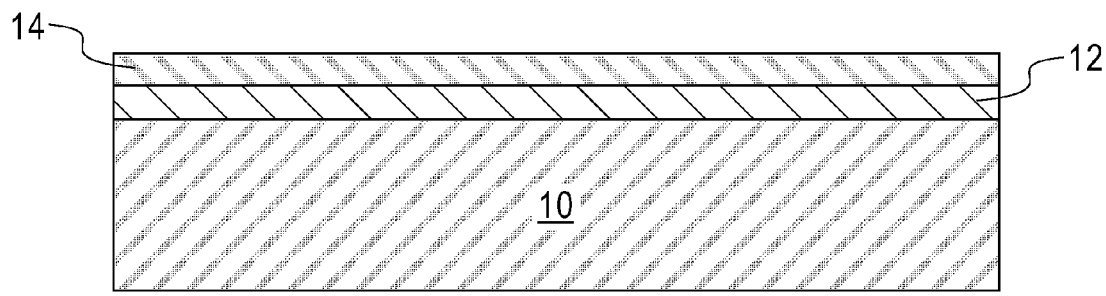
FIG. 1 is a cross sectional view of a first exemplary semiconductor structure including, from bottom to top, a handle substrate, a buried insulator layer, and a semiconductor layer that can be employed in one embodiment of the present application.

The present application will now be described in greater detail by referring to the following discussion and drawings that accompany the present application. It is noted that the drawings of the present application are provided for illustrative purposes and, as such, they are not drawn to scale. In the drawings and description that follows, like elements are described and referred to by like reference numerals.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

In current FinFET technologies, the semiconductor fin is typically comprised of silicon or a silicon germanium (SiGe) alloy having less than 30 atomic percent germanium. Hybrid channel FinFETs (i.e., Si nFET and SiGe pFET) have been proposed for 10 nm technologies and beyond. Fabrication of silicon germanium alloy fins having 30 atomic percent or greater of germanium is challenging due to the critical thickness of the silicon germanium alloy films with increasing germanium content. For example, silicon germanium alloys containing 30 atomic percent to 60 atomic percent germanium have a critical thickness of from 25 nm to 35 nm. Above this critical thickness, defects form to partially relieve the strain in the silicon germanium alloy. The present application provides a method for forming silicon germanium alloy fins containing 30 atomic percent or greater germanium. Such silicon germanium alloy fins containing 30 atomic percent or greater germanium may be referred to here as simply high percentage silicon germanium fins. The high percentage silicon germanium fins are partially relaxed, however a strain in the lengthwise direction of the high percentage silicon germanium fins exists.

Referring first to FIG. 1, there is illustrated a first exemplary semiconductor structure including, from bottom to top, a handle substrate 10, a buried insulator layer 12, and a semiconductor layer 14 that can be employed in one embodiment of the present application. Collectively the handle substrate 10, the buried insulator layer 12, and the semiconductor layer 14 can be referred to herein as a semiconductor-on-insulator (SOI) substrate. The handle substrate 10 provides mechanical support for the buried insulator layer 12 and the semiconductor layer 14.

The handle substrate 10 and the semiconductor layer 14 may comprise the same, or different, semiconductor material. The term "semiconductor" as used herein in connection with the semiconductor material of the handle substrate 10 and the semiconductor layer 14 denotes any semiconductor material including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate 10 and the semiconductor layer 14. In one embodiment, the handle substrate 10 and the semiconductor layer 14 are both comprised of silicon. In some embodiments, the handle substrate 10 is a non-semiconductor material including, for example, a dielectric material and/or a conductive material. In yet other embodiments, the handle substrate 10 can be omitted and a substrate including an insulator layer 12 and a semiconductor layer 14 can be used.

In some embodiments, the handle substrate 10 and the semiconductor layer 14 may have the same or different crystal orientation. For example, the crystal orientation of the handle substrate 10 and/or the semiconductor layer 14 may be {100}, {110}, or {111}. Other crystallographic orientations besides those specifically mentioned can also be used in the present application. The handle substrate 10 and/or the semiconductor layer 14 may be a single crystalline semiconductor material, a polycrystalline material, or an amorphous material. Typically, at least the semiconductor layer 14 is a single crystalline semiconductor material. In some embodiments, the semiconductor layer 14 that is located on an upper surface of the buried insulator layer 12 can be processed to include semiconductor regions having different crystal orientations.

The buried insulator layer 12 may be a crystalline or non-crystalline oxide or nitride. In one embodiment, the buried insulator layer 12 is an oxide such as, for example, silicon dioxide. The buried insulator layer 12 may be continuous or it may be discontinuous. When a discontinuous buried insulator region is present, the insulator region exists as an isolated island that is surrounded by semiconductor material.

The first exemplary semiconductor structure shown in FIG. 1 may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer 14 to a layer having a thickness that is more desirable.

In one example, the thickness of the semiconductor layer 14 can be from 100 Å to 1000 Å. In another example, the thickness of the semiconductor layer 14 can be from 500 Å to 700 Å. In some embodiments, and when an ETSOI (extremely thin semiconductor-on-insulator) substrate is employed as the first exemplary semiconductor structure, the semiconductor layer 14 can have a thickness of less than 100 Å. If the thickness of the semiconductor layer 14 is not within one of the above mentioned ranges, a thinning step such as, for example, planarization or etching can be used to reduce the thickness of the semiconductor layer 14 to a value within one of the ranges mentioned above. The buried insulator layer 12 typically has a thickness from 10 Å to 2000 Å, with a thickness from 1000 Å to 1500 Å being more typical. The thickness of the handle substrate 10 is inconsequential to the present application.

Figure 2:
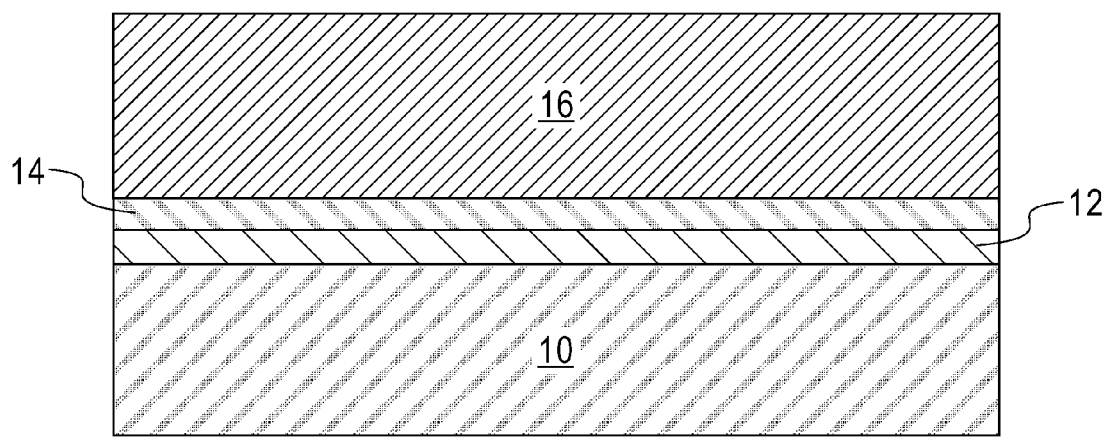
FIG. 2 is a cross sectional view of the first exemplary semiconductor structure of FIG. 1 after forming a layer of silicon germanium alloy containing 30 atomic percent or greater germanium and substitutional carbon on an upper surface of the semiconductor layer.

Referring now to FIG. 2, there is illustrated the first exemplary semiconductor structure of FIG. 1 after forming a layer of silicon germanium alloy 16 on an upper surface of the semiconductor layer 14. In one embodiment, the layer of silicon germanium alloy 16 comprises a different semiconductor material than the semiconductor layer 14. For example, the layer of silicon germanium alloy 16 contains 30 atomic percent or greater germanium, while the semiconductor layer comprises silicon. In another embodiment, the semiconductor layer comprises a same semiconductor material as the layer of silicon germanium alloy 16, yet the germanium content in the semiconductor layer 14 is less than the germanium content in the layer of silicon germanium alloy 16.

The layer of silicon germanium alloy 16 that is employed in the present application is strained and contains a silicon germanium alloy containing 30 atomic percent or greater of germanium; the upper germanium content of the silicon germanium alloy that can be employed in the present application is less than 100 atomic percent germanium. In one embodiment, the layer of silicon germanium alloy 16 that is employed in the present application is strained and contains a silicon germanium alloy containing 40 atomic percent or greater of germanium. In example, the layer of silicon germanium alloy 16 that is employed in the present application contains a silicon germanium alloy containing from 40 atomic percent germanium to 60 atomic percent germanium. In another example, the layer of silicon germanium alloy 16 that is employed in the present application contains a silicon germanium alloy containing greater than 60 atomic percent germanium to 80 atomic percent germanium.

The layer of silicon germanium alloy 16 that is employed in the present application also contains substitutional carbon. The term "substitutional" denotes that a carbon atom replaces at least one Si atom and/or Ge atom within the lattice of a silicon germanium alloy. In one embodiment of the present application, the silicon germanium alloy 16 that is employed in the present application contains from 0.1 atomic percent to 4.0 atomic percent of substitutional carbon. In another embodiment of the present application, the layer of silicon germanium alloy 16 that is employed in the present application contains from 0.5 atomic percent to 2.0 atomic percent of substitutional carbon. Applicants have determined that the presence of substitutional carbon compensates some amount of strain within the layer of silicon germanium alloy 16. Notably, Applicants have determined that 1 atomic percent of substitutional carbon roughly equals a SiGe alloy containing 10 atomic percent germanium. For example, adding 1.2 atomic percent substitutional carbon into a 60% SiGe film results in a layer having the strain of a 48% SiGe alloy.

The critically thickness of the layer of silicon germanium alloy 16 that is employed in the present application is typically from 30 nm to 50 nm. The term "critical thickness" as used throughout the present application denotes a thickness of the layer of silicon germanium alloy 16 at which the onset of defects such as, for example, misfit dislocations, is minimal. Beyond the critical thickness defects form in a layer of silicon germanium alloy and strain is relieved.

The layer of silicon germanium alloy 16 that is formed on the upper surface of semiconductor layer 14 has an epitaxial relationship with the upper surface of the semiconductor layer 14. That is, the layer of silicon germanium alloy 16 has a same crystallographic orientation as that of the upper surface of the semiconductor layer 14.

The layer of silicon germanium alloy 16 that is employed in the present application can be formed utilizing any epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming the layer of silicon germanium alloy 16 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming layer of silicon germanium alloy 16 typically ranges from 550° C. to 900° C. Although higher temperature typically results in faster deposition, the faster deposition may result in crystal defects and film cracking.

A number of different source gases may be used for the deposition of the layer of silicon germanium alloy 16. In one embodiment, a combination of a silicon source gas and a germanium source gas can be used in forming the layer of silicon germanium alloy. Examples of silicon source gases that can be used include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium source gases that can be used include germane, digermane, halogermane, dichlorogermane, trichlorogermane, tetrachlorogermane and combinations thereof. In some embodiments, a single source gas that includes a silicon component and a germanium component may be used in forming the layer of silicon germanium alloy 16. Carrier gases like hydrogen, nitrogen, helium and argon can be used during the epitaxial growth process.

The substitutional carbon can be added by introducing a carbon source gas into the gas mixture that is employed in the present disclosure for forming the layer of silicon germanium alloy 16. Examples of carbon source gases that can be used in the present application include, for example, alkylsilanes (such as, for example, mono-methylsilane), alkanes, alkenes, and alkynes.

Figure 3:
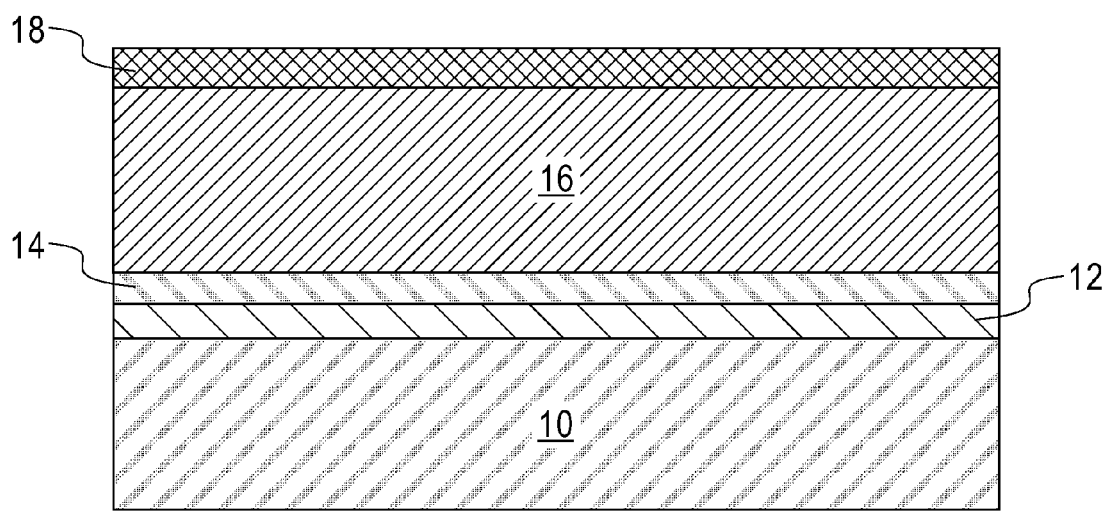
FIG. 3 is a cross sectional view of the first exemplary semiconductor structure of FIG. 2 after forming a hard mask layer on an upper surface of the layer of silicon germanium alloy.

Referring now to FIG. 3, there is illustrated the first exemplary semiconductor structure of FIG. 2 after forming a hard mask layer 18 on an upper surface of the layer of silicon germanium alloy 16. In some embodiments of the present application, the hard mask layer 18 can be omitted.

The hard mask layer 18 that can be employed in this embodiment of the present application may include a dielectric oxide, a dielectric nitride, a dielectric oxynitride or any multilayered combination thereof. In one embodiment, the hard mask layer 18 is a dielectric oxide such as silicon dioxide, while in another embodiment the hard mask layer 18 is a dielectric nitride such as silicon nitride. The hard mask layer 18 can be formed utilizing a deposition process including, for example, chemical vapor deposition (CVD), plasma enhanced chemical vapor deposition (PECVD), chemical solution deposition, evaporation, or physical vapor deposition (PVD). Alternatively, the hard mask layer 18 may be formed by one of thermal oxidation, and thermal nitridation. The thickness of the hard mask layer 18 employed in the present application may vary depending on the material of the hard mask layer 18 itself as well as the technique used in forming the same. Typically, and in one embodiment, the hard mask layer 18 has a thickness from 5 nm to 100 nm. Other thicknesses that are greater than or lesser than the aforementioned thickness range can also be used for the thickness of the hard mask layer 18.

In some embodiments of the present application (not shown), a block mask can be formed over the hard mask layer 18 in one area of the structure in which semiconductor fins containing a high percentage silicon germanium alloy are to be formed, and then in other areas of the structure (to the left-hand side and/or the right-hand side of the drawing shown in FIG. 3), the hard mask layer 18 and the layer of silicon germanium alloy 16 can be removed from the other areas such that semiconductor fins made only of semiconductor layer 14 are subsequently formed.

Figure 4:
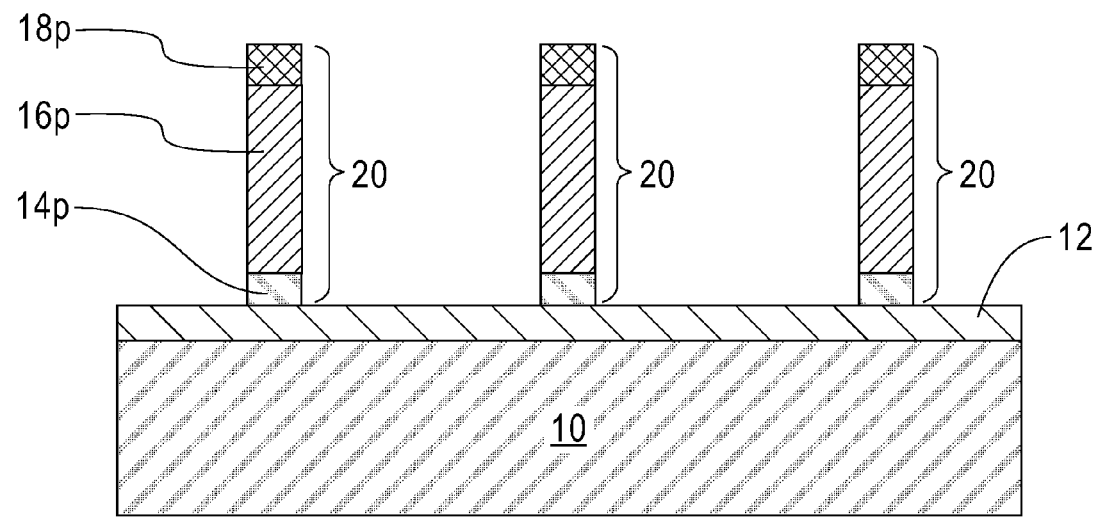
FIG. 4 is a cross sectional view of the first exemplary semiconductor structure of FIG. 3 after forming a plurality of placeholder semiconductor fins containing, from bottom to top, a semiconductor material portion and a silicon germanium alloy portion.

Referring now to FIG. 4, there is illustrated the first exemplary semiconductor structure of FIG. 3 after forming a plurality of placeholder semiconductor fins 20 containing, from bottom to top, a semiconductor material portion 14p and a silicon germanium alloy portion 16p. The term "placeholder" as used in conjunction with semiconductor fins 20 denotes an initial semiconductor fin structure that upon a subsequently performed anneal will be converted into a permanent semiconductor fin. Each placeholder semiconductor fin 20 will contain a silicon germanium alloy portion 16p containing 30 atomic percent or greater of germanium and a first content of substitutional carbon. After annealing, the formed permanent semiconductor fin will contain a silicon germanium alloy portion containing 30 atomic percent or greater of germanium and a second content of substitutional carbon, which is less than the first content of substitutional carbon.

Each placeholder semiconductor fin of the plurality of placeholder semiconductor fins 20 can be capped with a hard mask cap portion 18p. Although a plurality of placeholder semiconductor fins 20 are described and illustrated, a single placeholder semiconductor fin 20 can be formed at this point of the present application. Each placeholder semiconductor fin of the plurality of placeholder semiconductor fins 20 may be referred to herein as a composite placeholder semiconductor fin since it comprises the semiconductor material portion 14p and the silicon germanium alloy portion 16p.

The semiconductor material portion 14p of each placeholder semiconductor fin of the plurality of placeholder semiconductor fins 20 comprises a remaining portion of the semiconductor layer 14, the silicon germanium alloy portion 16p of each placeholder semiconductor fin of the plurality of placeholder semiconductor fins 20 comprises a remaining portion of the layer of silicon germanium alloy 16, and the hard mask cap portion 18 of each placeholder semiconductor fin of the plurality of placeholder semiconductor fins 20 comprises a remaining portion of the hard mask layer 18.

As used herein, a "semiconductor fin" refers to a contiguous structure including at least one semiconductor material and including a pair of vertical sidewalls that are parallel to each other. As used herein, a surface is "vertical" if there exists a vertical plane from which the surface does not device by more than three times the root mean square roughness of the surface.

In one embodiment of the present application, each placeholder semiconductor fin of the plurality of placeholder semiconductor fins 20 has a height from 10 nm to 100 nm, and a width from 4 nm to 30 nm. In another embodiment of the present application, each placeholder semiconductor fin of the plurality of placeholder semiconductor fins 20 has a height from 15 nm to 50 nm, and a width from 5 nm to 12 nm.

Also, each placeholder semiconductor fin of the plurality of placeholder semiconductor fins 20 is oriented parallel to each other. Further each placeholder semiconductor fin of the plurality of placeholder semiconductor fins 20 has a bottommost surface, i.e., a bottommost surface of the semiconductor material portion 14p, in direct contact with a topmost surface of the buried insulator layer 12.

As shown in the drawings, the remaining semiconductor portion 16p, the remaining silicon germanium alloy portion 16p and the hard mask cap portion 18 each have vertical sidewalls that are vertically coincident (i.e., vertically aligned") to each other. Stated in other terms, the vertical sidewalls of semiconductor material portion 16p, the remaining silicon germanium alloy portion 16p and the hard mask cap portion 18p of each placeholder semiconductor fin of the plurality of placeholder semiconductor fins 20 do not extend beyond each other.

Each placeholder semiconductor fin of the plurality of placeholder semiconductor fins 20 can be formed by lithography and etching. Lithography can include forming a photoresist (not shown) on the topmost surface of the hard mask layer 18, exposing the photoresist to a desired pattern of radiation, and then developing the exposed photoresist with a conventional resist developer to provide a patterned photoresist atop the hard mask layer 18. At least one etch is then employed which transfers the pattern from the patterned photoresist into the underlying materials utilizing the insulator layer 12 as an etch stop. Stated in other terms, at least one etch is performed utilizing the patterned photoresist as an etch mask. In one embodiment, the etch used for pattern transfer may include a dry etch process such as, for example, reactive ion etching, plasma etching, ion beam etching or laser ablation. In another embodiment, the etch used for pattern transfer may include a sidewall image transfer (SIT) process. After transferring the pattern into layers 18, 16 and 14, the patterned photoresist can be removed utilizing a conventional resist stripping process such as, for example, ashing. In some embodiment, the patterned resist can be removed after transferring the pattern into the hard mask layer 18.

After formation of placeholder semiconductor fins 20, a part of the strain within each silicon germanium alloy portion 16p is relaxed. Stain however remains in a lengthwise direction of each silicon germanium alloy portion 16p of each placeholder semiconductor fin. The lengthwise direction of each silicon portion 16p of each placeholder semiconductor fin 20 runs into and out of the view shown in FIG. 4.

Figure 5:
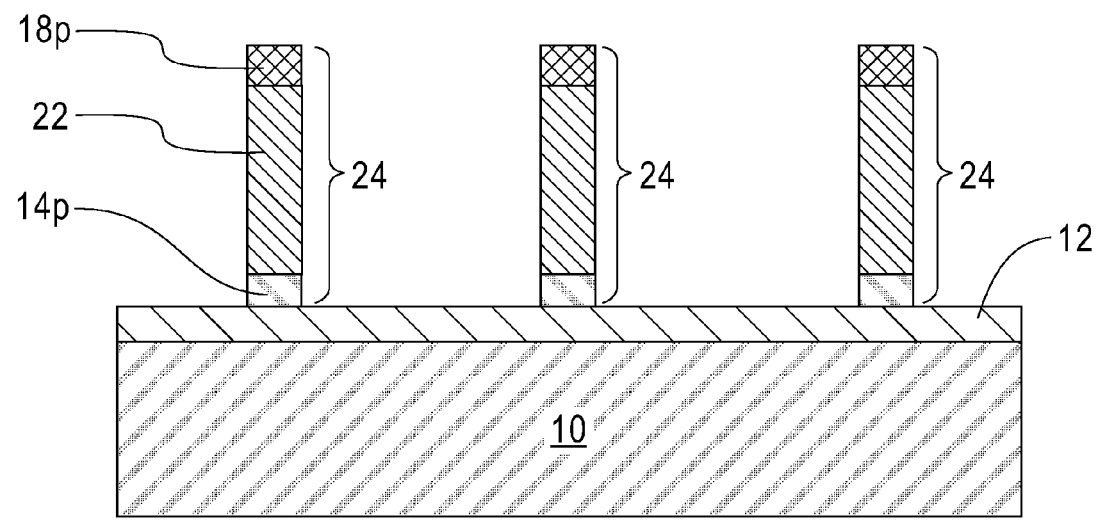
FIG. 5 is a cross sectional view of the first exemplary semiconductor structure of FIG. 4 after annealing which converts each placeholder semiconductor fin into a permanent semiconductor fin.

Referring now to FIG. 5, there is illustrated the first exemplary semiconductor structure of FIG. 4 after annealing which converts each placeholder semiconductor fin into a permanent semiconductor fin 24. Each permanent semiconductor fin 24 that is formed contains the semiconductor material portion 14p, as a base of the fin, and a silicon germanium alloy portion 22. Silicon germanium alloy portion 22 contains 30 atomic percent or greater germanium, a second content of substitutional carbon that is less than the first content of substitutional carbon in the silicon germanium alloy portion 16p of the placeholder semiconductor fin 20, and a strain that is in a lengthwise direction. In some embodiments, the second content of the substitutional carbon can be zero after annealing.

In one embodiment of the present application, the anneal may remove a portion of substitutional carbon from the silicon germanium alloy portion 16p of each placeholder semiconductor fin of the plurality of placeholder semiconductor fins 20. In another embodiment of the present application, the anneal may completely remove all the substitutional carbon from the silicon germanium alloy portion 16p of each placeholder semiconductor fin of the plurality of placeholder semiconductor fins 20. In either of these embodiments, the removed substitutional carbon may react with the annealing ambient. For example, and when the anneal includes oxygen, the removed substitutional carbon may react with oxygen forming $CO_2$.

In yet another embodiment of the present application, the anneal may move some or all of the substitutional carbon within the silicon germanium alloy portion 16p to an interstitial site within the silicon germanium alloy lattice. In the present application, an "interstitial site" is a site within a lattice of a silicon germanium alloy that is located between sites that contain silicon atoms and germanium atoms.

In a further embodiment of the present application, a first fraction of the substitutional carbon can be removed from the silicon germanium alloy portion 16p, while a second fraction the substitutional carbon in the silicon germanium alloy portion 16p can be moved from a substitutional site to an interstitial site.

The silicon germanium alloy portion of each permanent semiconductor fin of the plurality of permanent semiconductor fins 24 that is provided after annealing may be referred to herein as a reduced substitutional carbon-containing silicon germanium alloy portion 22. The reduced substitutional carbon-containing silicon germanium alloy portion 22 of each permanent semiconductor fin 24 has a substitutional carbon content that is less than the substitutional carbon content of the silicon germanium alloy portion 16p. The other elements of the permanent semiconductor fins 24 are the same as that of the placeholder semiconductor fins 20.

In one embodiment, the anneal that can be used to convert each silicon germanium alloy portion 16p of the plurality of placeholder semiconductor fins 20 into the reduced substitutional carbon-containing silicon germanium alloy portion 22 of the permanent semiconductor fin 24 can be performed at a temperature from 900° C. to 1250° C. In another embodiment, the anneal that can be used to convert each silicon germanium alloy portion 16p of the plurality of placeholder semiconductor fins 20 into the reduced substitutional carbon-containing silicon germanium alloy portion 22 of the permanent semiconductor fin 24 can be performed at a temperature from 950° C. to 1100° C.

In embodiments in which the anneal moves the carbon from substitutional sites to interstitial sites (with or without an additional layer to keep the fin shape), a quick anneal (from milliseconds to a few seconds) such as, for example, a rapid thermal anneal (RTA), a dynamic surface anneal (DSA) by Applied Materials, or laser anneal (LSA) can be employed. Longer anneals can be also be used as during isolation formation. The carbon movement occurs in the beginning of the anneal, longer anneal will not help movement. The anneal used in moving the carbon from substitutional sites to interstitial sites occurs in an inert ambient; oxygen is not used.

In embodiments in which the anneal removes the oxygen from the silicon germanium alloy portion 16p, an oxidation anneal is employed. In such an embodiment, at least the vertical sidewalls of each semiconductor fin should be free of an additional layer. In this embodiment, longer anneals (in the minutes range) are employed, to enable diffusion of the carbon to the surface of each semiconductor fin. In one example, a 5 minute to 10 minute RTA can be used. The oxidation anneal can be performed in ambient that contains an inert gas admixed with from 0.1% to 10% of oxygen.

Notwithstanding the type of anneal, the anneal that is employed in the present application does not form any defects within the reduced substitutional carbon-containing silicon germanium alloy portion 22 of each permanent semiconductor fin 24. The anneal also preserves the strain within each reduced substitutional carbon-containing silicon germanium alloy portion 22 of each permanent semiconductor fin 24. As such, each permanent semiconductor fin 24 has a higher percentage silicon germanium portion, and strain that is present in a lengthwise direction of the fin.

In some embodiments, each hard mask cap portion 18p can remain atop each silicon germanium portion 16p during the anneal. In other embodiments, each hard mask cap portion 18p can be removed from the top of each silicon germanium portion 16p prior to the anneal. In such an embodiment, a selective etch process or chemical mechanical planarization can be used to remove each hard mask cap portion 18p prior to the anneal.

Figure 6:
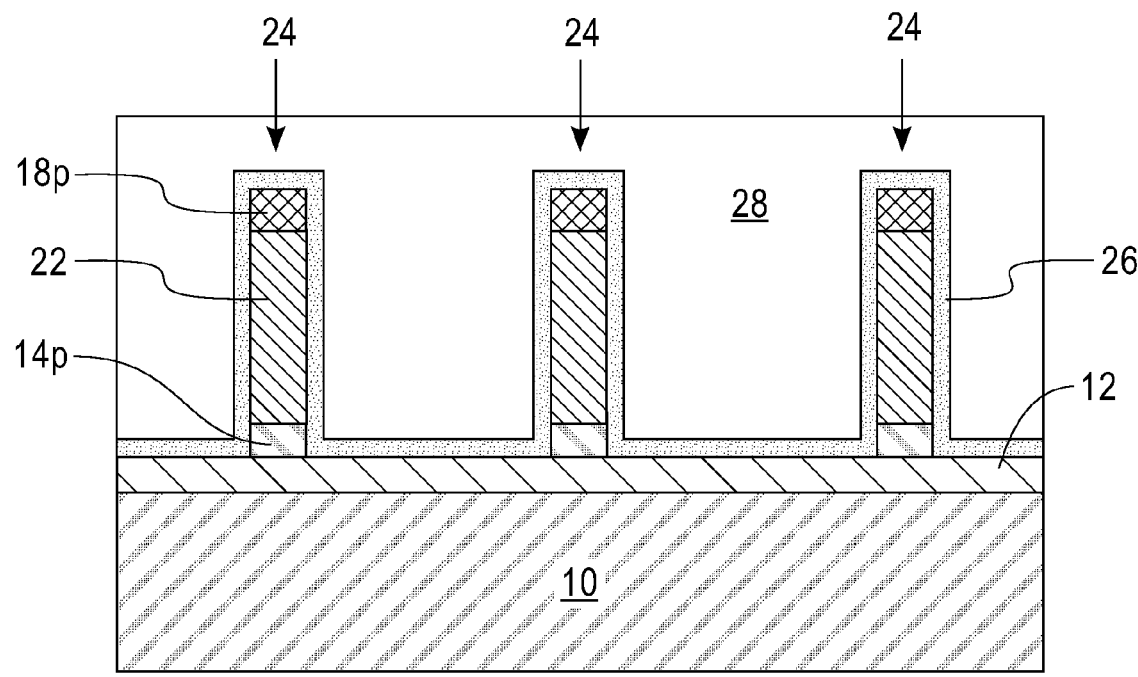
FIG. 6 is a cross sectional view of the first exemplary semiconductor structure of FIG. 5 after forming a gate structure straddling each permanent semiconductor fin of the plurality of permanent semiconductor fins.

Referring now to FIG. 6, there is illustrated the first exemplary semiconductor structure of FIG. 5 after forming a gate structure straddling each permanent semiconductor fin of the plurality of permanent semiconductor fins 24. The gate structure includes a gate dielectric portion 26 and a gate conductor portion 28. In one embodiment of the present application and as shown in FIG. 6, the gate dielectric portion 26 is formed on vertical sidewalls of each permanent semiconductor fin 24, as well as on vertical sidewalls and an upper surface of each hard mask cap portion 18p.

In another embodiment and when the hard mask cap portion 18p is removed from each semiconductor fin (not illustrated in FIG. 6, but shown for example in FIG. 7), the gate dielectric portion 26 is formed on vertical sidewalls and on an upper surface of each permanent semiconductor fin 24.

The gate structure formation begins by first forming the gate dielectric portion 26. The gate dielectric portion 26 may comprise a semiconductor oxide (such as, for example, silicon dioxide) or a high k material having a dielectric constant greater than silicon dioxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, or an alloy thereof. Each value of x is independently from 0.5 to 3 and each value of y is independently from 0 to 2.

The gate dielectric portion 26 can be formed by any deposition technique including, for example, chemical vapor deposition (CVD), plasma enhanced chemical vapor deposition (PECVD), physical vapor deposition (PVD), sputtering, or atomic layer deposition. In one embodiment of the present application, the gate dielectric portion 26 can have a thickness in a range from 1 nm to 10 nm. Other thicknesses that are lesser than or greater than the aforementioned thickness range can also be employed for the gate dielectric portion 26.

The gate conductor portion 28 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate conductor portion 28 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor portion 28 has a thickness from 1 nm to 100 nm. Other thicknesses that are lesser than or greater than the aforementioned thickness range can also be employed for the gate conductor portion 28.

Further semiconductor FinFET formation processes including spacer formation, source/drain formation and merging of exposed portions of each semiconductor fin can be performed utilizing techniques and materials that are otherwise known to those skilled in the art. These further semiconductor FinFET formation processes are not described and illustrated herein so as not to obscure the present application.

Figure 7:
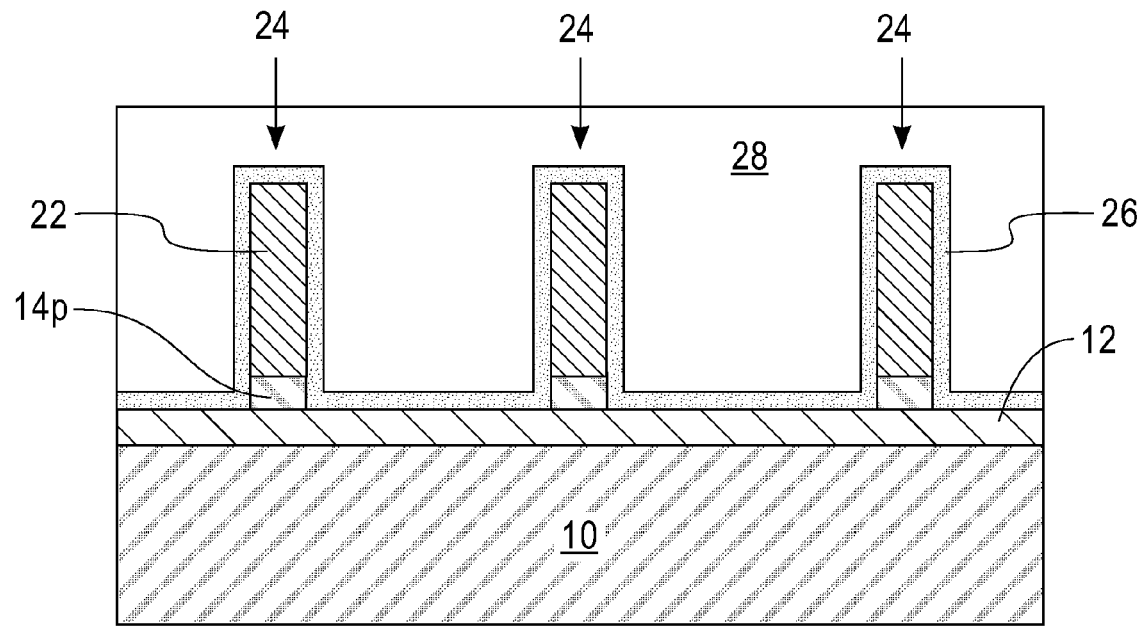
FIG. 7 is a cross sectional view of the first exemplary semiconductor structure of FIG. 5 after removing a hard mask cap portion from atop each permanent semiconductor fin and forming a gate structure straddling each permanent semiconductor fin.

Referring now to FIG. 7, there is illustrated the first exemplary semiconductor structure of FIG. 5 after removing the hard mask cap portion 18p from the structure and forming a gate structure straddling each permanent semiconductor fin of the plurality of permanent semiconductor fins 24 in accordance with another embodiment of the present application.

In some embodiments of the present application and as mentioned above, each hard mask cap portion 18p can be removed from the top of each silicon germanium portion 16p prior to performing the anneal and then the anneal described above can be performed. In other embodiments of the present application, each hard mask cap portion 18p can be removed from the top of each reduced interstitial carbon-containing silicon germanium portion 22 after the anneal. In either embodiment, a selective etch process or chemical mechanical planarization can be used to remove each hard mask cap portion 18p from the structure.

The gate structure shown in FIG. 7 includes a gate dielectric portion 26 and a gate conductor portion 28. The gate dielectric portion 26 and the gate conductor portion 28 shown in FIG. 7 can be provided utilizing techniques and materials mentioned above in forming the gate dielectric portion 26 and the gate conductor portion 28 to the structure shown in FIG. 6.

In some embodiments of the present application (not shown), hard mask cap portions 18p can be removed from some of the permanent semiconductor fin 24 (including semiconductor portion 14p and reduced interstitial carbon-containing silicon germanium portion 22), while other hard mask cap portions 18p can remain on the permanent semiconductor fin 24.

Figure 8:
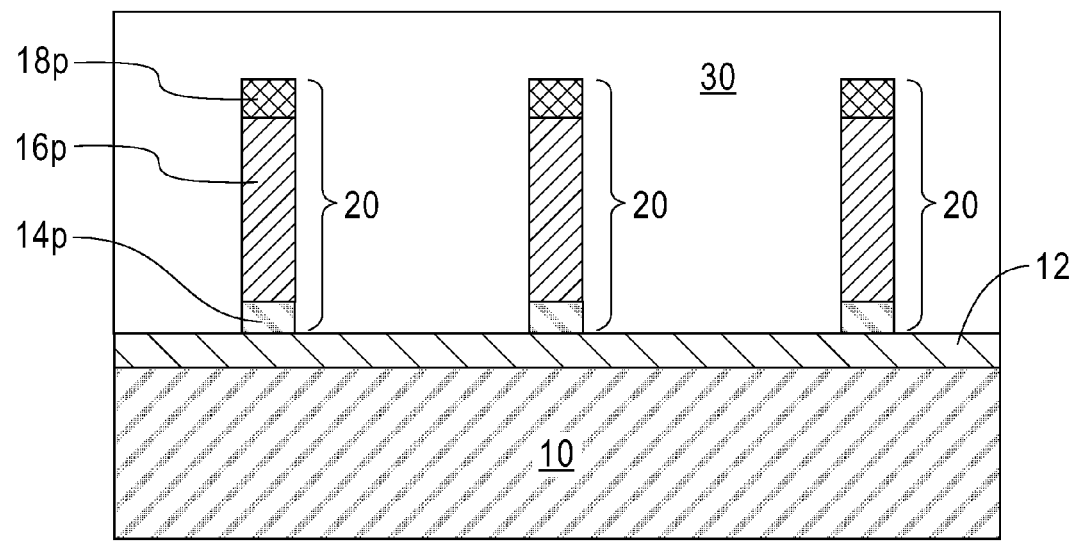
FIG. 8 is a cross sectional view of the first exemplary semiconductor structure of FIG. 4 after forming a protective layer on each placeholder semiconductor fin of the plurality of placeholder semiconductor fins in accordance with another embodiment of the present application.

Referring now to FIG. 8, there is illustrated the first exemplary semiconductor structure of FIG. 4 after forming a protective layer 32 on each placeholder semiconductor fin of the plurality of placeholder semiconductor fins 20 in accordance with another embodiment of the present application. As is shown, the protective layer 32 is located on exposed surfaces of the buried insulator layer 12 at the footprint of each placeholder semiconductor fin of the plurality of placeholder semiconductor fins 20, adjacent each placeholder semiconductor fin of the plurality of placeholder semiconductor fins 20 and atop each placeholder semiconductor fin of the plurality of placeholder semiconductor fins 20. As such, the height of the protective layer 32 is greater than the height of each placeholder semiconductor fin 20.

The protective layer 32 may comprise a trench dielectric oxide material such as, for example silicon dioxide. The protective layer 32 can be formed utilizing a deposition process such as, for example, chemical vapor deposition and plasma enhanced chemical vapor deposition.

Figure 9:
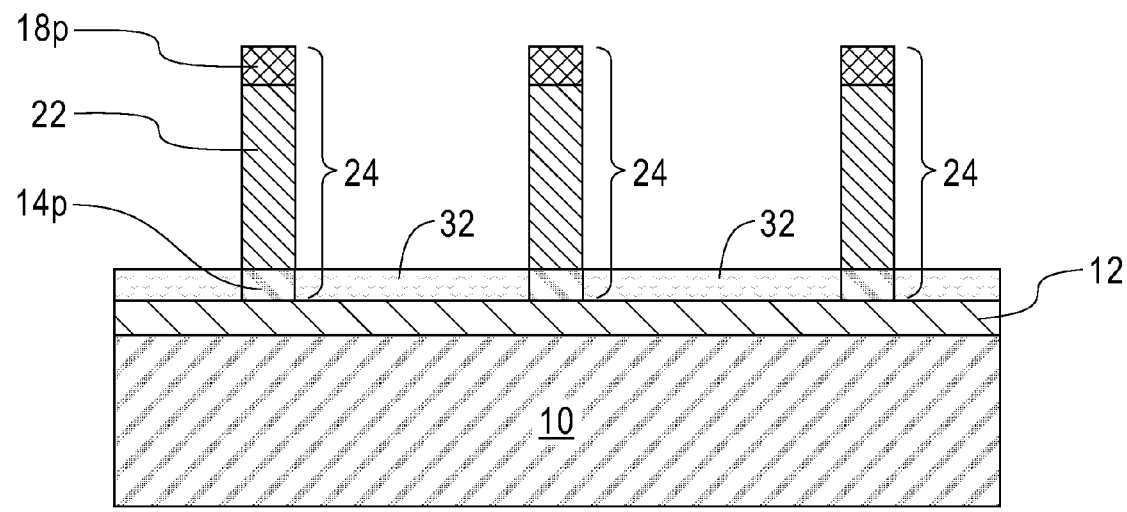
FIG. 9 is a cross sectional view of the first exemplary semiconductor of FIG. 7 after forming an isolation structure from the protective layer and converting each placeholder semiconductor fin into a permanent semiconductor fin.

Referring now to FIG. 9, there is illustrated the first exemplary semiconductor of FIG. 8 after forming an isolation structure 32 from the protective layer 30. Each isolation structure 32 can be formed by first annealing the deposited protective layer 30, followed by chemical mechanical planarization and then an etch back process can be employed. It is noted that the anneal used in this embodiment of the present application serves two proposes. First, the anneal serves to densify the protective layer 32. Second, the anneal serves to form the reduced interstitial carbon-containing silicon germanium alloy portion 22 of each permanent semiconductor fin 24; that is the anneal forms the permanent fin structure of the present application. The anneal used in the embodiment of the present application includes conditions and annealing ambients that are the same as those described above in forming the reduced interstitial carbon-containing silicon germanium alloy portion 22 of the permanent semiconductor fin 24 shown in FIG. 5 of the previous embodiment of the present application.

After forming the structure shown in FIG. 9, a gate structure including a gate dielectric portion and a gate dielectric portion can be formed as described above in providing the structure shown in FIG. 6 followed by other conventional FinFET processing steps. The hard mask cap portion 18p can be present atop each reduced interstitial carbon-containing silicon germanium alloy portion 22, or it can be removed from the structure as described above.

Figure 10:
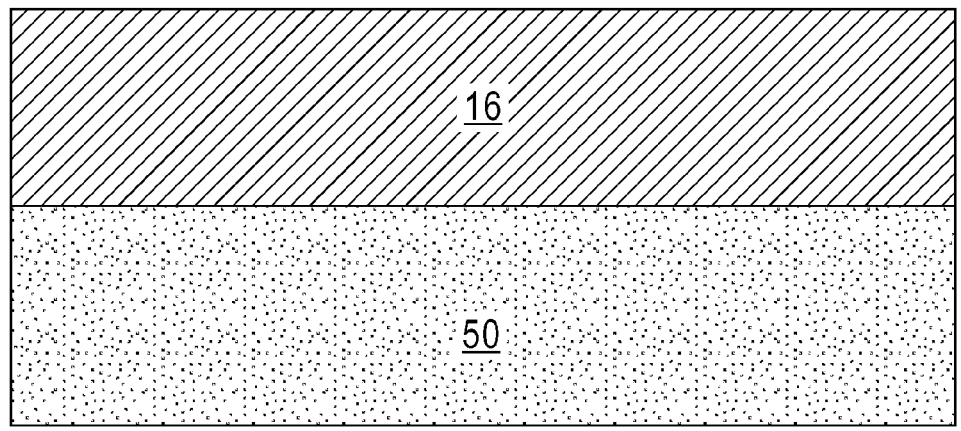
FIG. 10 is a cross sectional view of a second exemplary semiconductor structure including a layer of silicon germanium alloy containing 30 atomic percent or greater germanium and substitutional carbon located on an upper surface of a bulk semiconductor substrate in accordance with a further embodiment of the present application.

Referring now to FIG. 10, there is illustrated a second exemplary semiconductor structure including a layer of silicon germanium alloy 16 located on an upper surface of a bulk semiconductor substrate 50 in accordance with a further embodiment of the present application.

The layer of silicon germanium alloy 16 used in this embodiment of the present application can be provided using the techniques and materials mentioned above in forming the layer of silicon germanium alloy 16 on the semiconductor layer 14 of the SOI substrate.

The term "bulk semiconductor substrate" denotes a substrate that is entirely made from a semiconductor material. The semiconductor material that comprises the bulk semiconductor substrate 50 may comprise at least one of the semiconductor materials mentioned above in regard to the semiconductor layer 14 of the first exemplary semiconductor structure shown in FIG. 1 of the present application.

Figure 11:
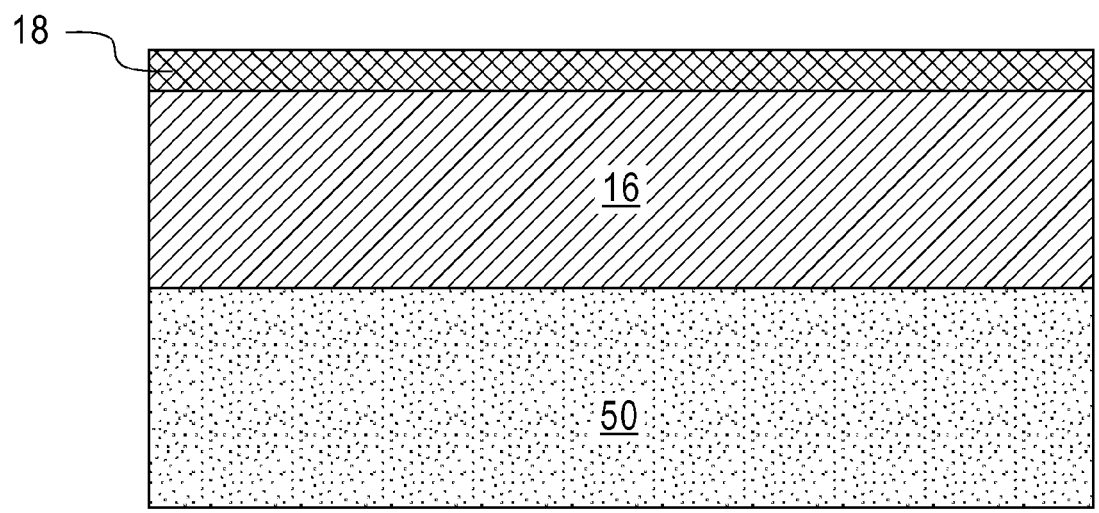
FIG. 11 is a cross sectional view of the second exemplary semiconductor structure of FIG. 10 after forming a hard mask layer on an upper surface of the layer of silicon germanium alloy.

Referring now to FIG. 11, there illustrated the second exemplary semiconductor structure of FIG. 10 after forming a hard mask layer 18 on an upper surface of the silicon germanium alloy 16. The hard mask layer 18 used in this embodiment can be provided using the techniques and materials mentioned above in forming the hard mask layer 18 to the first exemplary semiconductor structure shown FIG. 2 of the present application.

Figure 12:
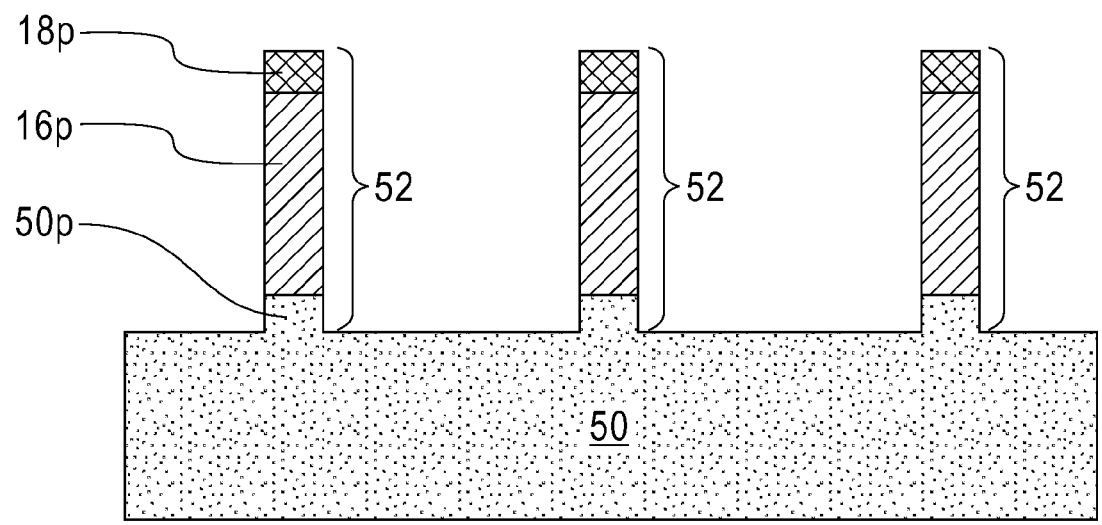
FIG. 12 is a cross sectional view of the second exemplary semiconductor structure of FIG. 11 after forming a plurality of placeholder semiconductor fins containing, from bottom to top, a semiconductor material portion and a silicon germanium alloy portion.

Referring now to FIG. 12, there is illustrated the second exemplary semiconductor structure of FIG. 11 after forming a plurality of placeholder semiconductor fins 52 containing, from bottom to top, a semiconductor material portion 50p and a silicon germanium alloy portion 16p. The plurality of placeholder semiconductor fins 52 can also include a hard mask cap portion 18p located on an upper surface of each silicon germanium alloy portion 16p.

The plurality of placeholder semiconductor fins 52 can be provided utilizing the same techniques as mentioned above in forming the plurality of placeholder semiconductor fins 20 shown in FIG. 4 of the present application. The plurality of placeholder semiconductor fins 52 provided in this embodiment of the present application can have the same basic characteristic as that of the plurality of placeholder semiconductor fins 20 shown in FIG. 4 except that in the present embodiment, the semiconductor material portion 50p is of unitary construction with the remaining portions of bulk semiconductor substrate 50. As such, the semiconductor material portion 50p of the plurality of placeholder semiconductor fins 52 has a bottom surface that directly contacts semiconductor material, not a buried insulator layer as was the case in the previous embodiment in which the plurality of placeholder semiconductor fins 20 were formed.

Figure 13:
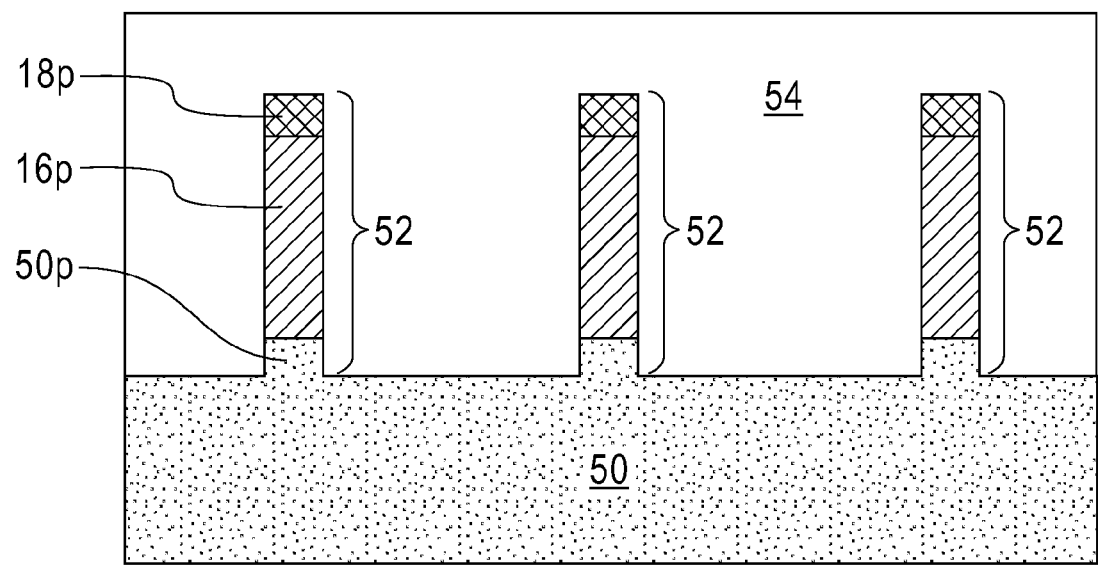
FIG. 13 is a cross sectional view of the second exemplary semiconductor structure of FIG. 12 after forming a protective layer on each placeholder semiconductor fin of the plurality of placeholder semiconductor fins.

Referring now to FIG. 13, there is illustrated the second exemplary semiconductor structure of FIG. 12 after depositing a protective layer 54 between and atop each of the semiconductor fins of the plurality of semiconductor fins 52. The protective layer 54 used in this embodiment of the present application is the same as that of protective layer 30 described above in connection with the structure shown in FIG. 8 of the present application.

Figure 14:
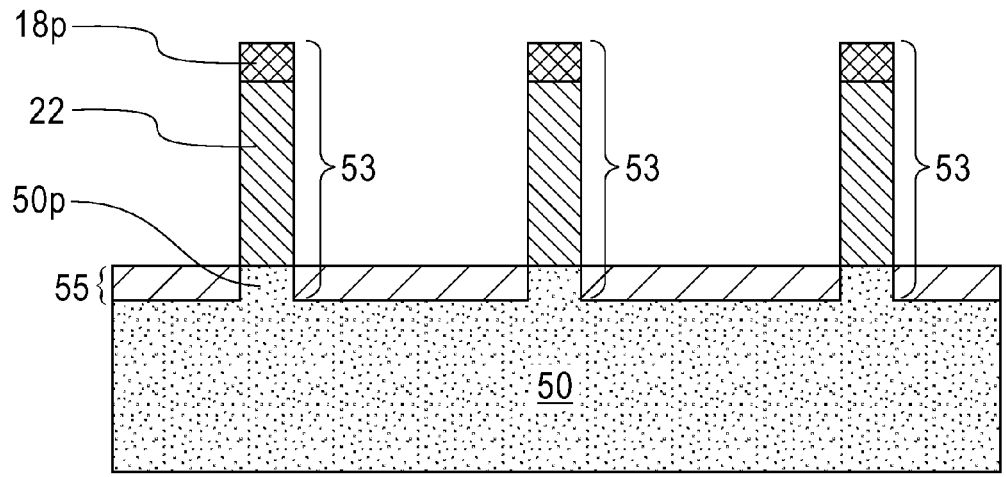
FIG. 14 is a cross sectional view of the second exemplary semiconductor structure shown in FIG. 13 after formation of an isolation structure from the protective layer and converting each placeholder semiconductor fin into a permanent semiconductor fin.

Referring now to FIG. 14, there is illustrated the second exemplary semiconductor structure shown in FIG. 13 after formation of an isolation structure 55 from the protective layer 54. The isolation structure 54 formed in this embodiment can be provided for by utilizing the same techniques, i.e., annealing, planarization and recess etching, as used in providing the isolation structures 32 shown in FIG. 9. In this embodiment, and unlike the isolation structures 32 shown in FIG. 9, a bottommost surface of each isolation structure 54 directly contacts a semiconductor material surface. It is noted that the anneal used in this embodiment also serves the same two proposes as mentioned above. Notably, the anneal densifies the trench dielectric oxide and converts each silicon germanium alloy portion 16p into a reduced interstitial carbon-containing silicon germanium alloy portion 22 of a permanent semiconductor fin 53. Each permanent semiconductor fin 53 of this embodiment includes semiconductor material portion 50p and reduced interstitial carbon-containing silicon germanium alloy portion 22.

In some embodiments, the protective layer 52 and the isolation structures 54 are not formed. In such an embodiment, the placeholder semiconductor fins 52 can be converted into the permanent semiconductor fin 53 by just anneal as described above in providing the structure shown in FIG. 5 of the present application.

Figure 15:
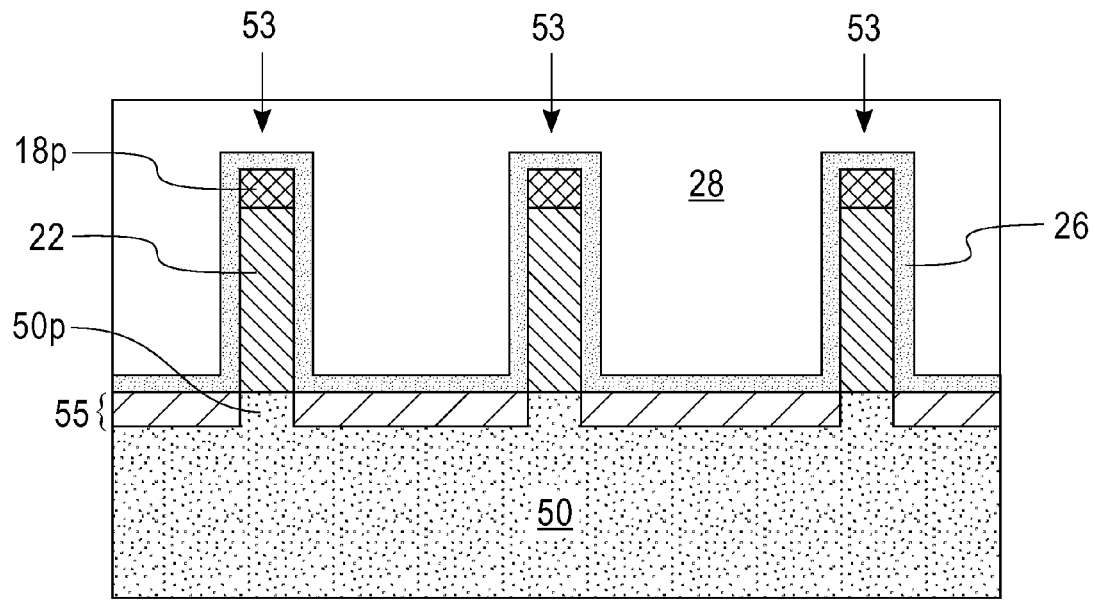
FIG. 15 is a cross sectional view of the second exemplary semiconductor structure shown in FIG. 14 after forming a gate structure that straddles each permanent semiconductor fin.

Referring now to FIG. 15, there is illustrated the second exemplary semiconductor structure of FIG. 14 after forming a gate structure that straddles each permanent semiconductor fin of the plurality of permanent semiconductor fins 53. The gate structure includes a gate dielectric portion 26 and a gate conductor portion 28.

The description with respect to the gate dielectric portion 26 and the gate conductor portion formed in FIG. 6 of the present application applies equally well here for this embodiment of the present application. Further semiconductor FinFET formation processes including spacer formation, source/drain formation and merging of exposed portions of each semiconductor fin can be performed as are known to those skilled in the art. These further semiconductor FinFET formation processes are not described and illustrated herein so as not to obscure the present application. As described above, the hard mask fin portion 18p can be removed from the structure prior to forming the gate structure.

While the present application has been particularly shown and described with respect to various embodiments thereof, it will be understood by those skilled in the art that the foregoing and other changes in forms and details may be made without departing from the spirit and scope of the present application. It is therefore intended that the present disclosure not be limited to the exact forms and details described and illustrated, but fall within the scope of the appended claims.

What is claimed is:

1. A method of forming a semiconductor structure comprising:

forming at least one placeholder semiconductor fin on a surface of a substrate, wherein said at least one placeholder semiconductor fin comprises, from bottom to top, a semiconductor material portion and a silicon germanium alloy portion, said silicon germanium alloy portion contains 30 atomic percent or greater germanium, a first content of substitutional carbon and a strain in a lengthwise direction of said at least one placeholder semiconductor fin; and annealing said at least one placeholder semiconductor fin, wherein said annealing converts said at least one placeholder semiconductor fin into at least one permanent semiconductor fin comprises, for bottom to top, said semiconductor material portion and a silicon germanium alloy portion, said silicon germanium alloy portion of said at least one permanent semiconductor fin contains 30 atomic percent or greater germanium, a second content of substitutional carbon and a strain in a lengthwise direction of said at least one permanent semiconductor fin, wherein said second content of substitutional carbon is less than said first content of substitutional carbon.

2. The method of claim 1, wherein said forming the at least one placeholder semiconductor fin comprises:

epitaxially growing a layer of silicon germanium alloy containing 30 atomic percent or greater germanium and said first content of substitutional carbon on a semiconductor material of said substrate;

forming a patterned photoresist on a surface of said layer of silicon germanium alloy; and etching exposed portions of said layer of silicon germanium alloy and underlying portions of said semiconductor material of said substrate utilizing said patterned photoresist as an etch mask.

3. The method of claim 2, wherein said layer of silicon germanium alloy is strained, and after forming said at least one placeholder semiconductor fin, said silicon germanium alloy portion contains a strain only in a lengthwise direction.

4. The method of claim 1, wherein said annealing at least partially removes some of said substitutional carbon as carbon dioxide.

5. The method of claim 1, wherein said annealing at least partially moves some of said substitutional carbon into an interstitial lattice sites.

6. The method of claim 1, wherein said annealing is performed at a temperature from 900° C. to 1250° C. in the absence of oxygen.

7. The method of claim 6, wherein said annealing is performed at a temperature from 900° C. to 1250° C. in presence of an inert gas admixed with from 0.1% to 10% oxygen.

8. The method of claim 1, wherein said annealing is performed during a process of forming an isolation structure on exposed surfaces of said substrate.

9. The method of claim 1, wherein said at least one permanent semiconductor fin further includes a hard mask cap portion located on an upper surface of said silicon germanium alloy portion.

10. The method of claim 1, further comprising forming a gate structure straddling said at least one permanent semiconductor fin, wherein said forming said gate structure comprises:
- depositing a gate dielectric portion on at least vertical sidewalls of said at least one permanent semiconductor fin; and
- forming a gate conductor portion on said gate dielectric portion and atop an upper surface of said at least one permanent semiconductor fin.

* * * * *